(12) United States Patent
Wang

(10) Patent No.: US 6,780,039 B2
(45) Date of Patent: Aug. 24, 2004

(54) CONNECTOR PACKAGING TRAY WITH SUPPORTING STANDOFFS

(75) Inventor: Wen Xin Wang, Kunsan (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/394,364

(22) Filed: Mar. 20, 2003

(65) Prior Publication Data
US 2004/0115981 A1 Jun. 17, 2004

(30) Foreign Application Priority Data
Dec. 17, 2002 (TW) .................................. 91220449 U

(51) Int. Cl.$^7$ .................................................. H01R 4/50
(52) U.S. Cl. ...................................... 439/342; 206/726
(58) Field of Search ........................ 439/342, 73, 331, 439/526, 68, 70, 72, 525; 324/158; 206/331, 322

(56) References Cited

U.S. PATENT DOCUMENTS 6,357,595 B2 * 3/2002 Sembonmatsu et al. .... 206/726

2003/0134542 A1 * 7/2003 He ............................. 439/677

* cited by examiner

Primary Examiner—P. Austin Bradley
Assistant Examiner—Phuongchi Nguyen
(74) Attorney, Agent, or Firm—Wei Te Chung

(57) ABSTRACT

A packaging tray (2) includes an elongate base (3). The base includes supporting portions (31) for receiving CPU sockets (1) therein. Each supporting portion includes four sidewalls (311), and a bottom wall (313) having an upper surface and a lower surface. Each sidewall forms an inwardly extending rib (312). Four standoffs (314) are formed on the lower surface. When mounting the CPU sockets on the upper surfaces, each CPU socket rests on the corresponding ribs, and solder balls of the CPU socket are supported by the corresponding upper surface. Thus, in handling of the CPU sockets, the solder balls are unlikely to sustain damage. Conversely, the CPU sockets can be reverse mounted on the lower surfaces. The solder balls of each CPU socket are located in a horizontal plane face up, with the standoffs supporting the CPU socket. The solder balls can be accurately inspected by a flatness inspection device.

2 Claims, 4 Drawing Sheets

US 6,780,039 B2

CONNECTOR PACKAGING TRAY WITH SUPPORTING STANDOFFS

BACKGROUND OF THE INVENTION

1. Field of the Invention

The present invention relates to a packaging tray, and particularly to a packaging tray used for receiving a plurality of components such as electrical connectors therein, and providing easy and safe transportation and handling of the components.

2. Description of the Prior Art

Delicate electronic components, such as computer Central Processing Unit (CPU) sockets, are often received in a customized packaging tray. Numerous such trays are stacked into freight containers for transportation and handling of the components. Referring to FIG. 3, CPU sockets 8 (only one shown) are received in a conventional packaging tray 9 such as that disclosed in U.S. application Ser. No. 10/266,489. Each CPU socket 8 comprises a multiplicity of solder balls (not shown) on a bottom thereof, and a pick up cap 81 assembled on a top thereof. The pick up cap 81 provides a flat surface for attaching to a vacuum suction device (not shown) on an assembly line. The packaging tray 9 comprises an elongate base 91, and a pair of ears formed respectively on opposite ends of the base 91. The base 91 comprises a number of supporting portions 94, 95 arranged in a regular rectangular array, for respectively receiving the CPU sockets 8 therein. Each supporting portion 94, 95 comprises four sidewalls 941 forming a rectangular frame. On each sidewall 941, the supporting portion 94, 95 forms a rib 942 extending into the frame. Some of the supporting portions 94 that are located at each of opposite ends of the base 91 each define a hole 944. Other supporting portions 95 located at a middle of the base 91 each comprise a bottom wall 951.

The CPU sockets 8 normally are mounted from a top side of the packaging tray 9 into the supporting portions 94, 95, respectively. Each CPU socket 8 rests on the corresponding ribs 942. The solder balls of those CPU sockets 8 mounted in the supporting portions 95 are supported by the bottom walls 951. However, the solder balls of other CPU sockets 8 mounted in the supporting portions 94 are exposed by the holes 944 to an exterior of the packaging tray 9 below the base 91. Thus, during transportation and handling of the CPU sockets 8, the solder balls exposed by the holes 944 are liable to sustain damage and/or break away from their CPU sockets 8.

In addition, the CPU sockets 8 are also routinely reverse mounted on the bottom walls 951 of the supporting portions 95 of the packaging tray 9. That is, the top of each CPU socket 8 having the pick up cap 81 rests on the corresponding bottom wall 951, with the bottom of the CPU socket 8 having the solder balls facing up. Thus, the solder balls can be inspected by a flatness inspection device (not shown) for uniform flatness. However, the pick up cap 81 is typically made of thermoplastic material, and is liable to sustain deformation or warping. When deformation or warping occurs, the inspection of the solder balls for uniform flatness is inaccurate. This interferes with quality control of the CPU sockets 8.

In view of the above, a new packaging tray that overcomes the above-mentioned disadvantages is desired.

SUMMARY OF THE INVENTION

Accordingly, an object of the present invention is to provide a packaging tray for receiving delicate components such as central processing unit (CPU) sockets therein, thereby protecting solder balls of the CPU sockets against harm during transportation and handling of the CPU sockets.

Another object of the present invention is to provide a packaging tray that allows reliable inspection for uniform flatness of solder balls of CPU sockets received in the packaging tray.

To achieve the above-mentioned objects, a connector packaging tray in accordance with a preferred embodiment of the present invention comprises an elongate base, and a pair of ears formed on opposite ends of the base. The base comprises a number of supporting portions arranged in a regular rectangular array, for respectively receiving CPU sockets each having a multiplicity of solder balls attached thereon. Each supporting portion comprises four sidewalls forming a rectangular frame. Each sidewall forms a rib extending into the frame. Each supporting portion comprises a bottom wall having an upper surface and a lower surface. Four standoffs are formed on the lower surface. When mounting a plurality of the CPU sockets on the upper surfaces of the bottom walls, each CPU socket rests on the corresponding ribs, and the solder balls of the CPU socket are supported by the corresponding upper surface. Thus, in transportation and handling of the CPU sockets, the solder balls are unlikely to sustain damage and/or break away from their CPU sockets. Conversely, a plurality of the CPU sockets can be reverse mounted on the lower surfaces of the bottom walls of the supporting portions. When this is done, the solder balls of each CPU socket are located in a horizontal plane face up, with the standoffs supporting the CPU socket. The solder balls can be accurately inspected for uniform flatness by a flatness inspection device.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
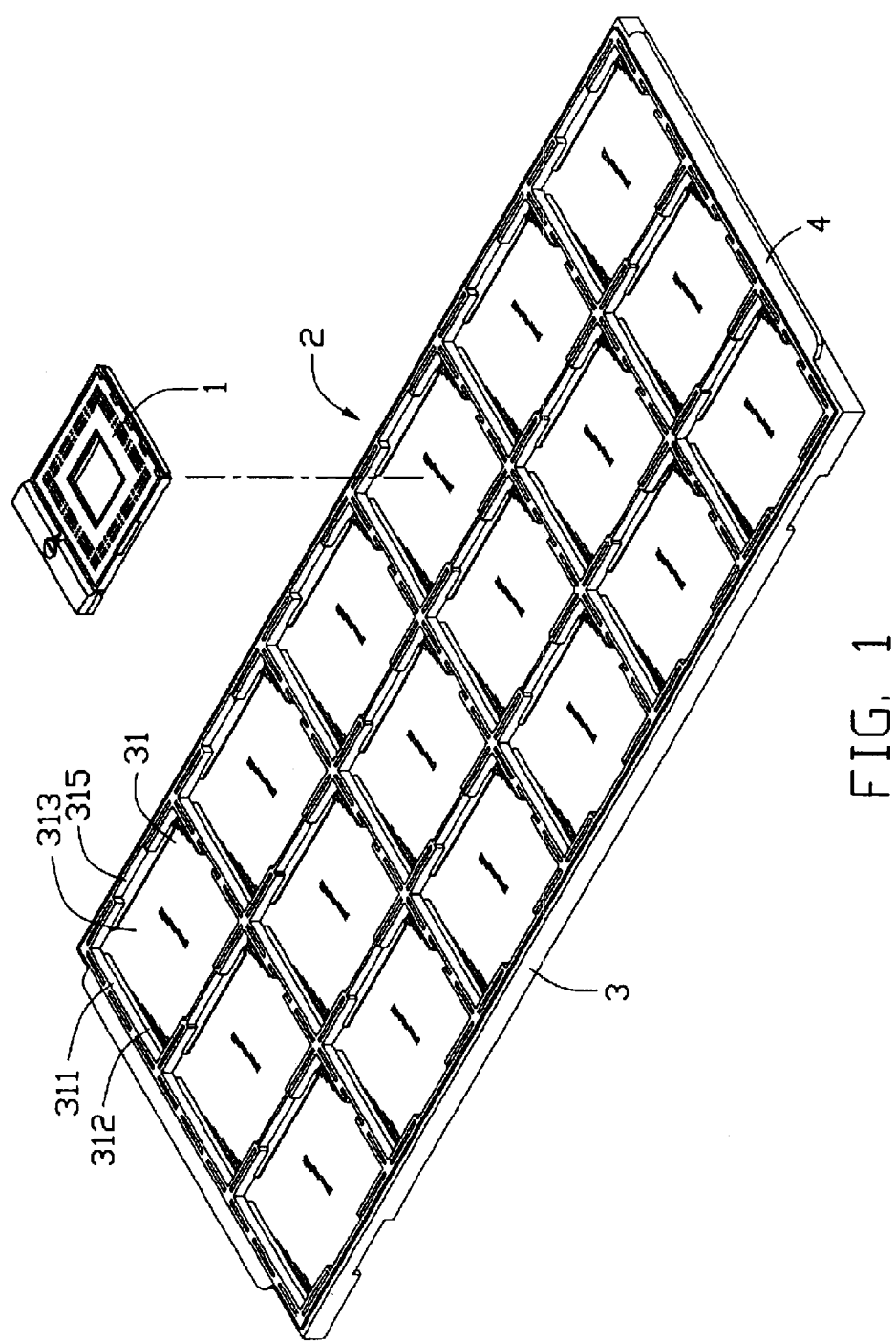
FIG. 1 is an isometric view of a packaging tray in accordance with the preferred embodiment of the present invention, together with a CPU socket ready to be received in the packaging tray.

Referring to FIG. 1, a connector packaging tray 2 is used for receiving several components such as central processing unit (CPU) sockets 1 (only one shown) therein, and providing safe and easy transportation and handling of the CPU sockets 1. Each CPU socket 1 is used for electrically connecting a CPU (not shown) to a circuit substrate such as a printed circuit board (PCB) (not shown) in a personal computer. The CPU socket 1 has a top surface and a bottom surface. A multiplicity of solder balls (not shown) is provided on the bottom surface of the CPU socket 1, the solder balls being adapted for electrically connecting with the PCB by welding.

Figure 2:
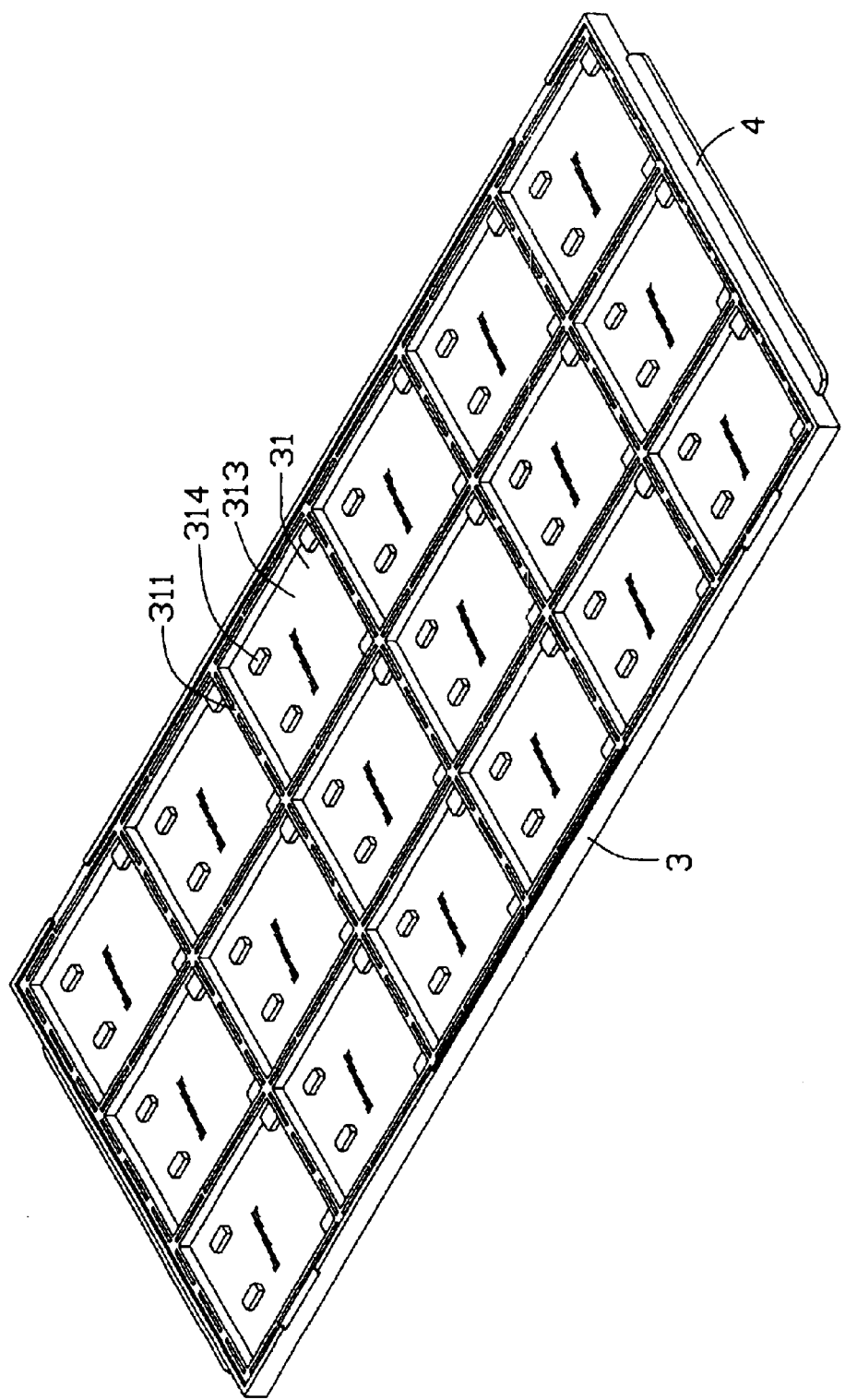
FIG. 2 is an isometric view of the packaging tray of FIG. 1, but showing the packaging tray inverted.
Figure 2A:
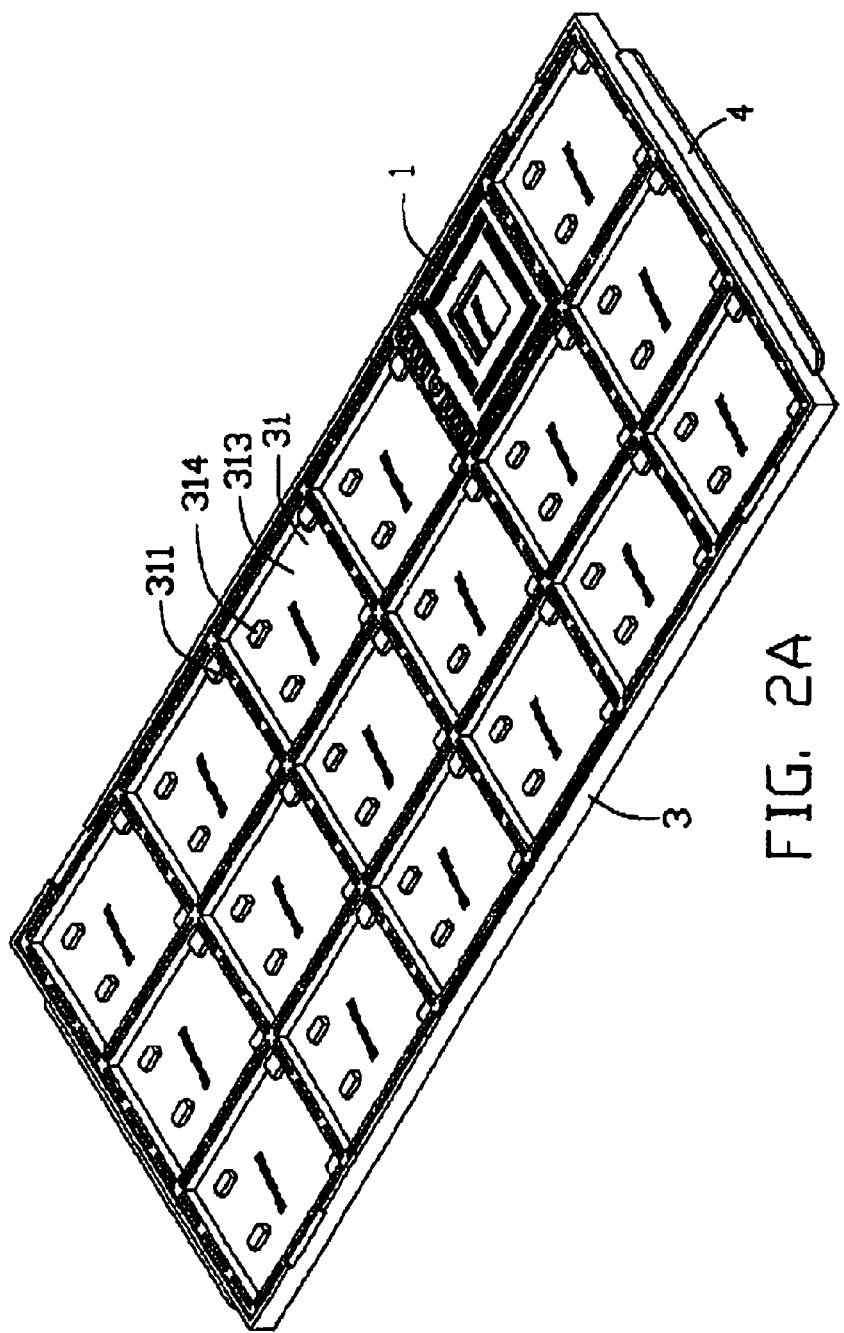
Figure 3:
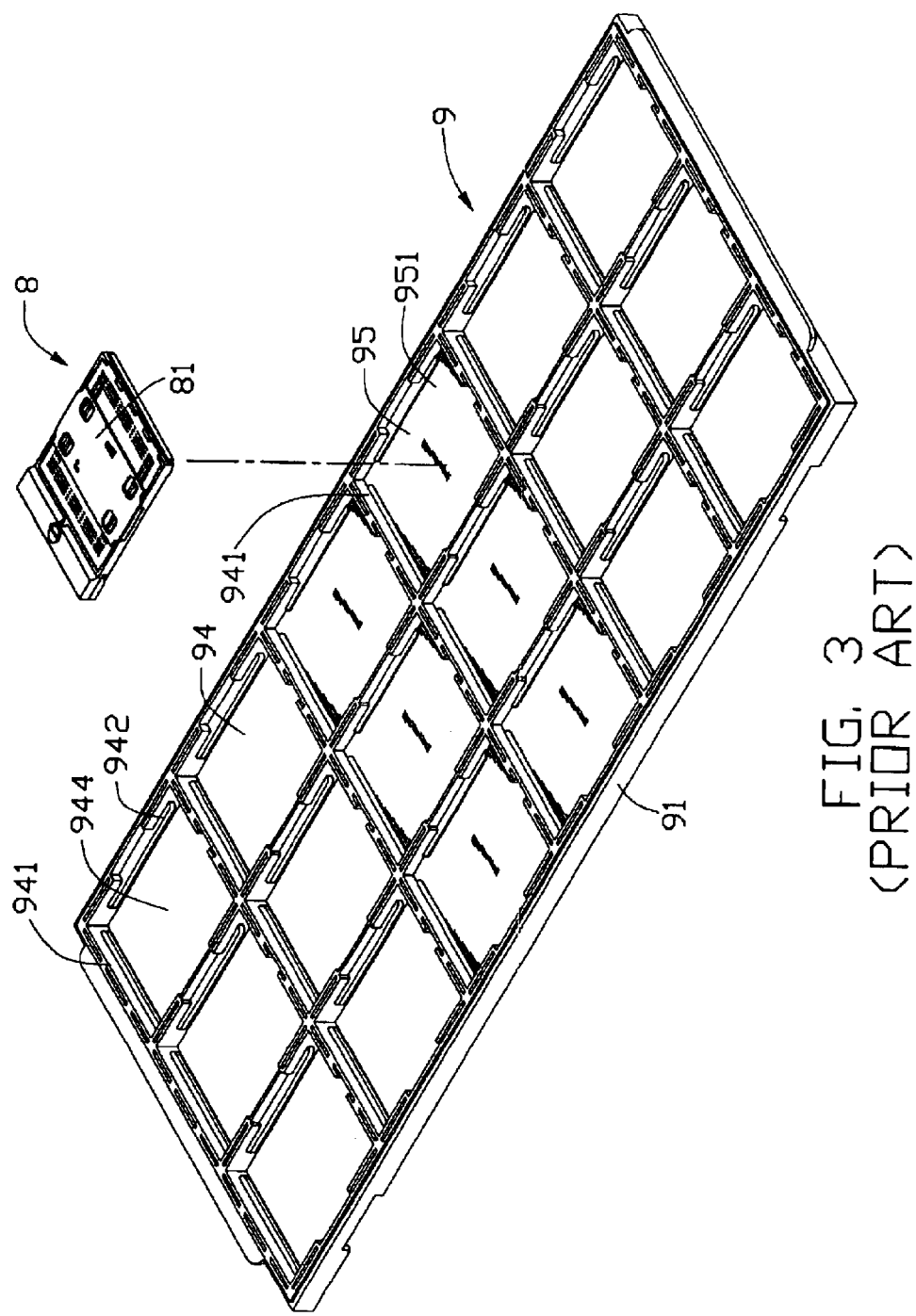
FIG. 3 is an isometric view of a conventional packaging tray, together with a CPU socket having a pick up cap, the CPU socket being ready to be received in the packaging tray.

The packaging tray 2 comprises an elongate base 3, and a pair of ears 4 formed respectively on opposite ends of the base 3. The base 3 comprises a number of supporting portions 31 arranged in a regular rectangular array. Each supporting portion 31 comprises four sidewalls 311 forming a rectangular frame. Each sidewall 311 forms a rib 312 extending into the frame. A pair of recesses 315 is defined in two opposite of the sidewalls 311. The recesses 315 are configured to facilitate receipt of one CPU socket 1 in the supporting portion 31, and to facilitate removal of the CPU socket 1 from the supporting portion 31. Each supporting portion 31 comprises a bottom wall 313 having an upper surface and a lower surface. The bottom wall 313 integrally extends between the sidewalls 311. Also referring to FIG. 2, four standoffs 314 are formed on the lower surface of the bottom wall 313. Two of the standoffs 314 are located at respective corners of the bottom wall 313, and the other two of the standoffs 314 are located at a portion of the bottom wall 313 that is distal from said corners.

A plurality of the CPU sockets 1 is mounted on the upper surfaces of the bottom walls 313 of the packaging tray 2. The bottom surface of each CPU socket 1 rests on the corresponding ribs 312, and the solder balls of the CPU socket 1 are supported by the upper surface of the corresponding bottom wall 313. Thus, in transportation and handling of the CPU sockets 1, the solder balls are unlikely to sustain damage and/or break away from their CPU sockets 1.

Conversely, a plurality of the CPU sockets 1 can be reverse mounted on the lower surfaces of the bottom walls 313 of the packaging tray 2. The top surface of each CPU socket 1 is supported by four corresponding standoffs 314. Thus, the solder balls of the CPU socket 1 are located face up in a horizontal plane, and the solder balls can be accurately inspected by a flatness inspection device (not shown) for uniform flatness.

While a preferred embodiment in accordance with the present invention has been shown and described, equivalent modifications and changes known to persons skilled in the art according to the spirit of the present invention are considered within the scope of the present invention as defined in the appended claims.

What is claimed is:

1. A connector packaging tray comprising:

an elongate base including a plurality of supporting portions in arrays, each of some of said supporting portions defining a frame with a plurality of sidewalls linked by a bottom wall along at least one direction, said bottom wall being located around a middle portion of the frame in a vertical direction, said bottom wall defining opposite upper and lower surfaces, a first cavity being defined above the upper surface and in the frame, a second cavity being defined under the lower surface and in the frame, at least one rib formed around one of the sidewalls for supporting a normally loaded connector for delivery, and at least one standoff formed on the lower surface of the bottom wall and in the second cavity for supporting an upside-down loaded connector for inspection; wherein said at least one standoff is located around a middle portion of the bottom wall and is properly configured and located for being completely located under the upside-down connector;

wherein a bottom end of the at least standoff is higher than a bottom face of the frame.

2. An assembly comprising:

a packaging tray and a plurality of electrical connectors being received in the packaging tray, each of the connector having a plurality of solder balls, said tray including an elongate base including a plurality of supporting frame with a plurality of sidewalls linked by a bottom wall at least along a direction, said bottom wall being located around a middle portion of the frame in a vertical direction, said bottom wall defining opposite upper and lower surfaces, a first cavity being defined above the upper surface and in the frame, a second cavity being defined under the lower surface and in the frame, and at least one standoff formed on the lower surface of the bottom wall and in the second cavity; wherein said tray is arranged in an upside-down manner, and said connector is upside down loaded in the second cavity with a top face of the connector abutting against a bottom end of the said at least one standoff; wherein said standoff is located around a middle portion of the bottom wall and completely under the connector;

wherein a pairs of recesses is defined in tow opposite sides of the sidewalls to facilitate receipt of one connector in the supporting portion, and to facilitate removal of the connector from the supporting portion;

wherein the solder balls of each of the connectors are supported by the upper surface of the corresponding bottom wall;

wherein fours standoffs are provided on the upper surface of each of the bottom walls;

wherein two of the standoffs are located are respectively corners of the bottom wall, and the other two of the standoffs are located at a portion of the bottom wall that is distal from said corners.

* * * * *